(12) United States Patent
Tsujino et al.

(10) Patent No.: US 9,640,452 B2
(45) Date of Patent: May 2, 2017

(54) ELECTRONIC COMPONENT HOUSING PACKAGE AND ELECTRONIC DEVICE

(71) Applicant: KYOCERA Corporation, Kyoto-shi, Kyoto (JP)

(72) Inventors: Mahiro Tsujino, Kyoto (JP); Daisuke Sakumoto, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 14/787,496

(22) PCT Filed: Sep. 25, 2014

(86) PCT No.: PCT/JP2014/075362
§ 371 (c)(1),
(2) Date: Oct. 28, 2015

(87) PCT Pub. No.: WO2015/046292
PCT Pub. Date: Apr. 2, 2015

(65) Prior Publication Data
US 2016/0104650 A1  Apr. 14, 2016

(30) Foreign Application Priority Data
Sep. 25, 2013  (JP) .................................. 2013-198454

(51) Int. Cl.
*H01L 23/48* (2006.01)
*H01L 23/047* (2006.01)
(Continued)

(52) U.S. Cl.
CPC ........... *H01L 23/047* (2013.01); *H01G 4/224* (2013.01); *H01L 23/057* (2013.01);
(Continued)

(58) Field of Classification Search
CPC ......... H01L 2924/0002; H01L 2924/00; H01L 23/047; H01L 23/057; H01L 23/492;
(Continued)

(56) References Cited

U.S. PATENT DOCUMENTS 4,992,801 A * 2/1991 Saito .................... H01Q 1/1271
343/713
5,018,050 A * 5/1991 Maenishi ............... H05K 7/209
335/202
(Continued)

FOREIGN PATENT DOCUMENTS

JP  05-335431 A  12/1993
JP  2003-017608 A  1/2003

OTHER PUBLICATIONS

International Search Report, PCT/JP2014/075362, Oct. 28, 2014, 1 pg.

*Primary Examiner* — Mohammed Shamsuzzaman
(74) *Attorney, Agent, or Firm* — Volpe and Koenig, P.C.

(57) ABSTRACT

An electronic component housing package has an input/output member that is bonded to a hole part of a frame body via a brazing material. This input/output member has a top surface that is bonded to first side wall parts and a second side wall part inside the first side wall parts, and the top surface is provided with a narrow part having a narrow width at a portion that is bonded to the first side wall part. When the input/output member is bonded, the flow of the brazing material on the top surface can be controlled by the narrow part.

5 Claims, 5 Drawing Sheets

(51) Int. Cl.
  *H01L 23/057* (2006.01)
  *H01G 4/224* (2006.01)
  *H01L 23/492* (2006.01)
  *H01L 33/48* (2010.01)
  *H01S 5/022* (2006.01)
  *H01G 2/10* (2006.01)

(52) U.S. Cl.
  CPC .......... *H01L 23/492* (2013.01); *H01L 33/483* (2013.01); *H01S 5/02208* (2013.01); *H01S 5/02248* (2013.01); *H01G 2/10* (2013.01); *H01L 33/48* (2013.01); *H01L 2924/0002* (2013.01); *H01S 5/02216* (2013.01); *H01S 5/02284* (2013.01)

(58) Field of Classification Search
  CPC ........ H01L 33/483; H01G 2/10; H01G 4/224; H01S 5/02208; H01S 5/02248
  USPC .......... 257/693, 690; 385/91, 92; 361/301.3, 361/752, 807
  See application file for complete search history.

(56) References Cited

U.S. PATENT DOCUMENTS

| | | | | |
|---|---|---|---|---|
| 8,721,192 | B2* | 5/2014 | Miyadera | G02B 6/30 385/14 |
| 2005/0207092 | A1* | 9/2005 | Kubota | H01L 23/047 361/301.3 |
| 2010/0252313 | A1* | 10/2010 | Tsujino | H01L 23/057 174/260 |
| 2013/0128489 | A1* | 5/2013 | Satake | H01L 23/057 361/820 |
| 2015/0123737 | A1* | 5/2015 | Yokoo | H03H 9/0552 331/34 |
| 2015/0195935 | A1* | 7/2015 | Shibayama | H05K 5/0247 361/807 |

* cited by examiner

ELECTRONIC COMPONENT HOUSING PACKAGE AND ELECTRONIC DEVICE

TECHNICAL FIELD

The present invention relates to an electronic component housing package having a multi-terminal input/output section, and an electronic device.

BACKGROUND ART

The package described in Patent Document 1, for example, is known as an electronic component housing package (hereinafter, also simply referred to as package) that houses an electronic component. The package described in Patent Document 1 includes an insulating input/output member fixed to a notch portion formed in a metal frame body. The input/output member has a plurality of electrodes for mounting terminals—extending into and out of the metal frame body.

In recent years, attempts have been made to achieve higher integration of electronic devices that use such packages. In this respect, higher integration is coped with by the use of a package configured to have a plurality of insulating members mentioned above such as the package described in Patent Document 2.

CITATION LIST

Patent Literature

Patent Document 1: Japanese Unexamined Patent Application Publication No. H5-335431A
Patent Document 2: Japanese Unexamined Patent Application Publication No. 2003-17608A

SUMMARY OF INVENTION

Technical Problem

While high integration of electronic devices has been promoted as described above, miniaturization of electronic devices is also sought concurrently. Therefore, miniaturization of the packages is pursued. Implementing high integration of the package disclosed in Patent Document 1 increases the number of wiring conductors (electrodes for mounting terminals). Due to the limited width of the insulating member, increasing the number of wiring conductors narrows the pitch between the wiring conductors. This raises a problem such that the connection between the wiring conductors and an electronic component with bonding wires becomes difficult.

When the number of the input/output members (input/output terminals) is increased as done in a package described in Patent Document 2, the limitation to the width of the input/output members is relaxed, facilitating the connection between the wiring conductors and an electronic component with bonding wires. However, the provision of a plurality of input/output members makes the miniaturization of the package difficult, and complicating the assembly of the package.

When the dimension of the input/output members is increased to increase the number of the wiring conductors, upon bonding of the input/output members to the metal frame body via, for example, a brazing material, the brazing material flows to be unevenly distributed, making it difficult to evenly bond the input/output members to the metal frame body.

The present invention has been made in view of the above problems, and an object of the invention is to provide an electronic component housing package that can achieve high integration and miniaturization, and is easily bonded and assembled, and an electronic device using the package.

Solution to Problem

An electronic component housing package according to an aspect of the invention includes a metal base plate having a mount region on a top surface where an electronic component is mounted, a metal frame body placed on the top surface of the base plate so as to surround the mount region, and an input/output member bonded to the frame body. The metal frame body includes a plurality of side wall parts including a pair of first side wall parts disposed facing each other so as to place the mount region between the pair of first side wall parts, and a second side wall part disposed so as to connect end portions of the pair of first side wall parts. The metal frame body also includes a hole part having opening to an inner side surface and an outer side surface extending from the second side wall part to the pair of first side wall parts. The input/output member is bonded to the hole part via a brazing material. The input/output member includes protruding parts inward of the pair of first side wall parts and the second side wall part and outward of the second side wall part, and includes a plurality of wiring conductors to be electrically connected to the electronic component on the protruding parts. The input/output member also includes a top surface to be bonded to the first side wall parts and the second side wall part. The top surface is provided with a narrow part having a narrow width at a portion where the top surface is bonded to the first side wall part.

In the electronic component housing package according to the aspect of the invention, the narrow part may be formed by forming a recessed groove extending vertically in an upper end of a wall surface of the input/output terminal.

In the electronic component housing package according to the aspect of the invention, the recessed groove may be provided on an inner wall surface of the input/output terminal.

In the electronic component housing package according to the aspect of the invention, the recessed groove may be provided on each of those wall surfaces which are bonded to the pair of first side wall parts.

In the electronic component housing package according to the aspect of the invention, the recessed grooves may be provided on those wall surfaces which are bonded to the first side wall parts and are equidistant from the second side wall part.

An electronic device according to an aspect of the invention includes the electronic component housing package according to the aspect of the invention, an electronic component mounted in the mount region of the electronic component housing package and connected to the wiring conductors via conductors, and a lid bonded to the top surface of the frame body to seal the electronic component.

Advantageous Effects of Invention

According to the electronic component housing package and the electronic device according to the above-described aspects, the input/output member includes protruding parts inward of the pair of first side wall parts and the second side wall part and outward of the second wall part, and includes a plurality of wiring conductors to be electrically connected to the electronic component on the protruding parts. Accordingly, even a compact package can have a lot of wiring conductors disposed on the input/output member. In addition, the number of the input/output members to be provided on the package can be reduced, thus ensuring miniaturization of an electronic component housing package and an electronic device.

The input/output member also includes a top surface to be bonded to the first side wall parts and the second side wall part, and the top surface is provided with a narrow part having a narrow width at a portion where the top surface is bonded to the first side wall part. This makes it possible to control the flow of the brazing material flowing through the top surface of the output member with the narrow part, making it easier to implement the work of bonding the input/output member via the brazing material.

Further, the formation of the narrow part by forming the recessed groove extending vertically in the upper end of the wall surface of the input/output terminal makes it easier to provide the narrow part.

Moreover, the provision of the recessed groove on the inner wall surface of the input/output terminal ensures miniaturization of the electronic component housing package.

Furthermore, the provision of the recessed groove on each of those wall surfaces which are bonded to the pair of first side wall parts makes it possible to control the flow of the brazing material on the first side wall part of each two sides of the output member in the recessed groove.

In addition, as the recessed grooves are provided on those wall surfaces which are bonded to the first side wall parts and are equidistant from the second side wall part, a uniform amount of the brazing material flows on each first side wall part of the input/output member, so that the both forces of bonding the first side wall parts on both sides of the second side wall part can be made equal. As a result, it is possible to make the breakage at the bonding parts of the input/output member with the base plate and the frame body difficult to occur by twisting of the base plate and the frame or local concentration of stress.

DESCRIPTION OF EMBODIMENTS

The following describes an electronic component housing package 10 and an electronic device 100 according to one embodiment of the invention with reference to the drawings. The drawings are each exemplary, and may be different in actual dimensions.

Figure 1:
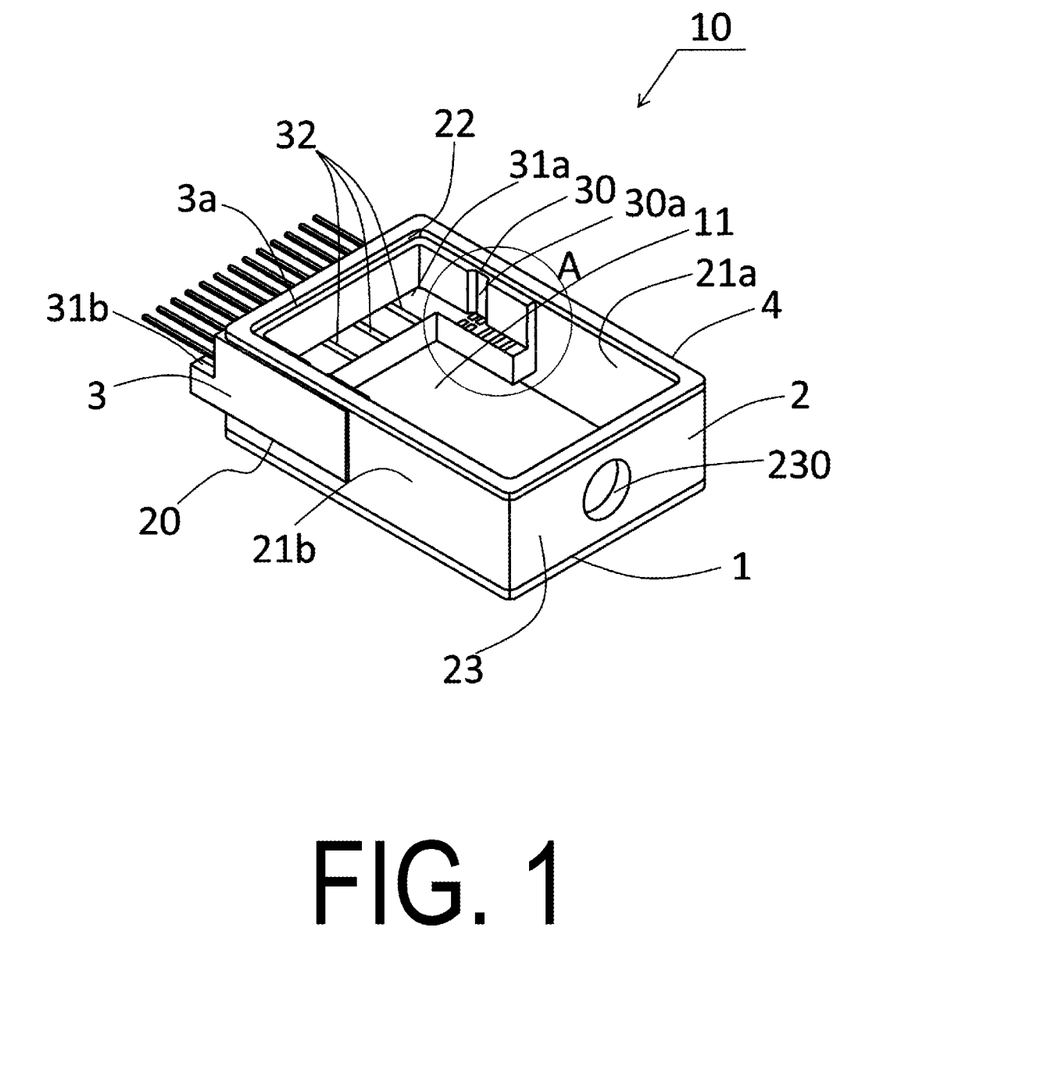
FIG. 1 is a perspective view illustrating an electronic component housing package according to one embodiment of the invention.
Figure 2:
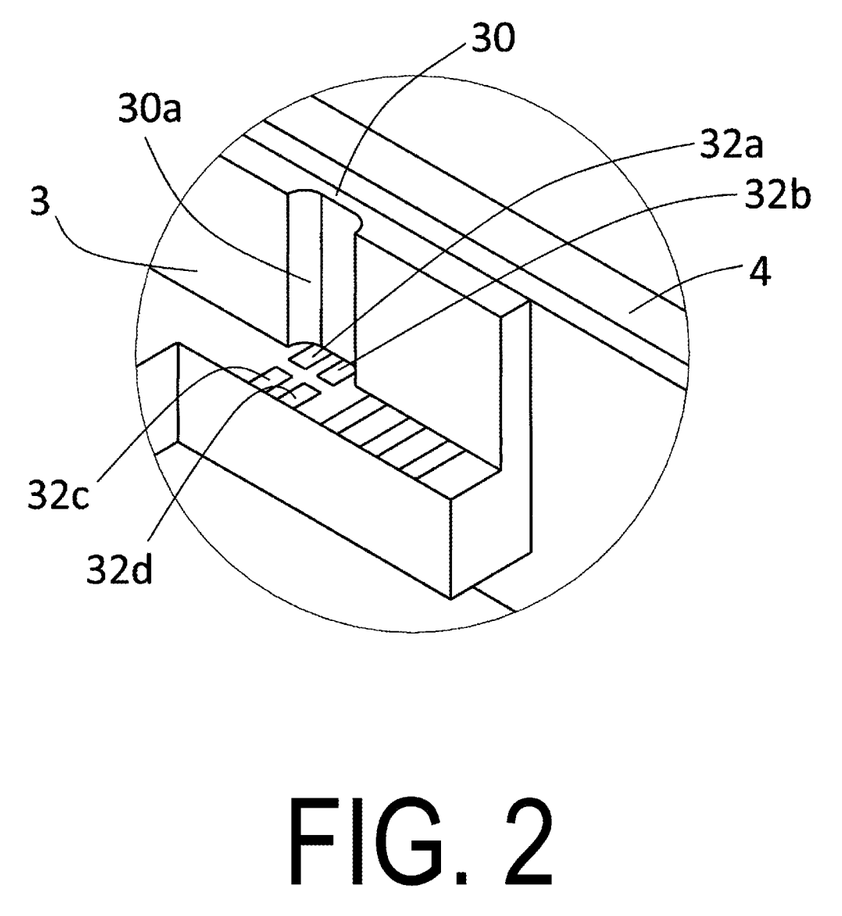
FIG. 2 is a partially enlarged view of a section A illustrated in FIG. 1.
Figure 3:
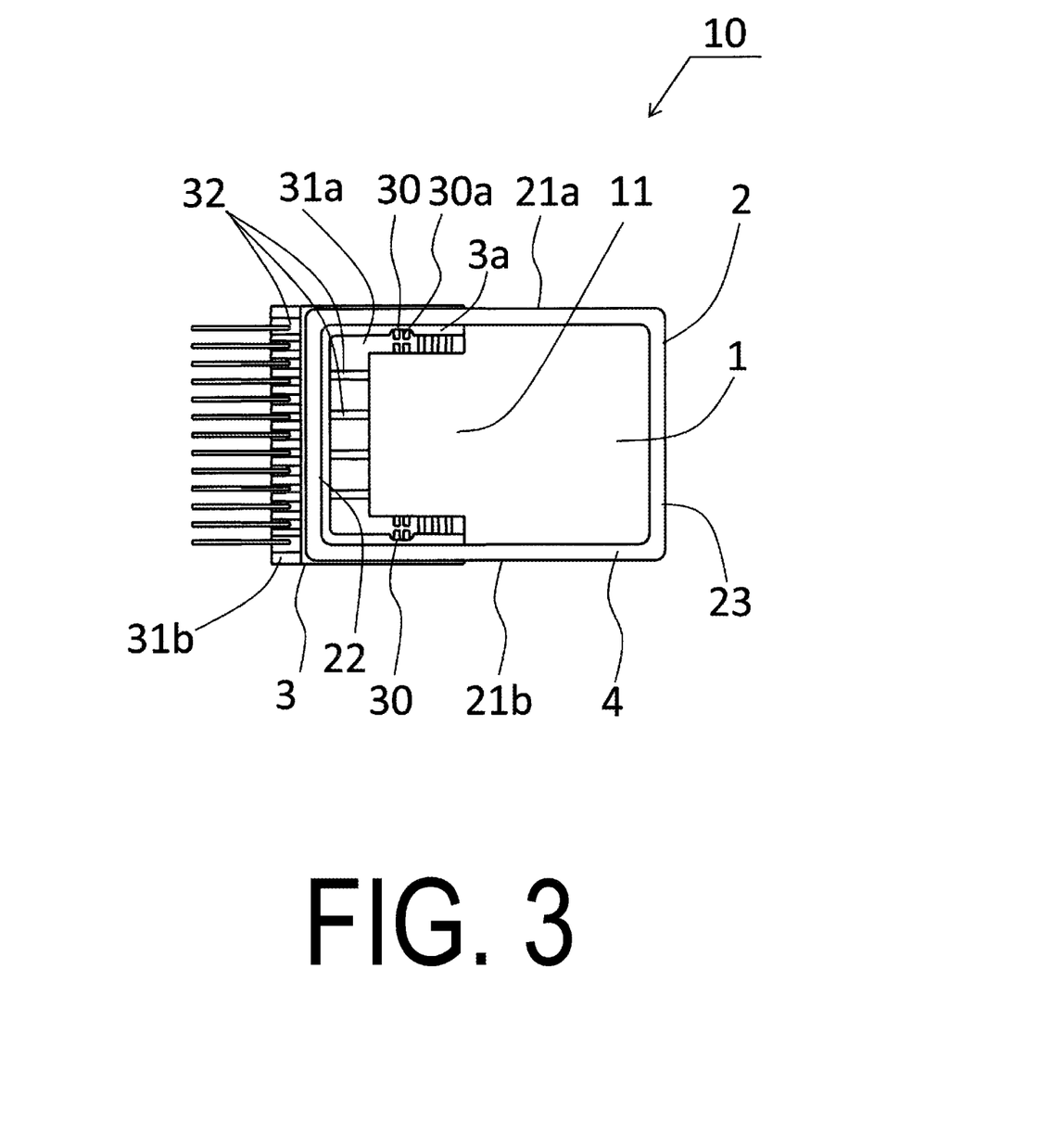
FIG. 3 is a plan view of the electronic component housing package illustrated in FIG. 1.
Figure 4:
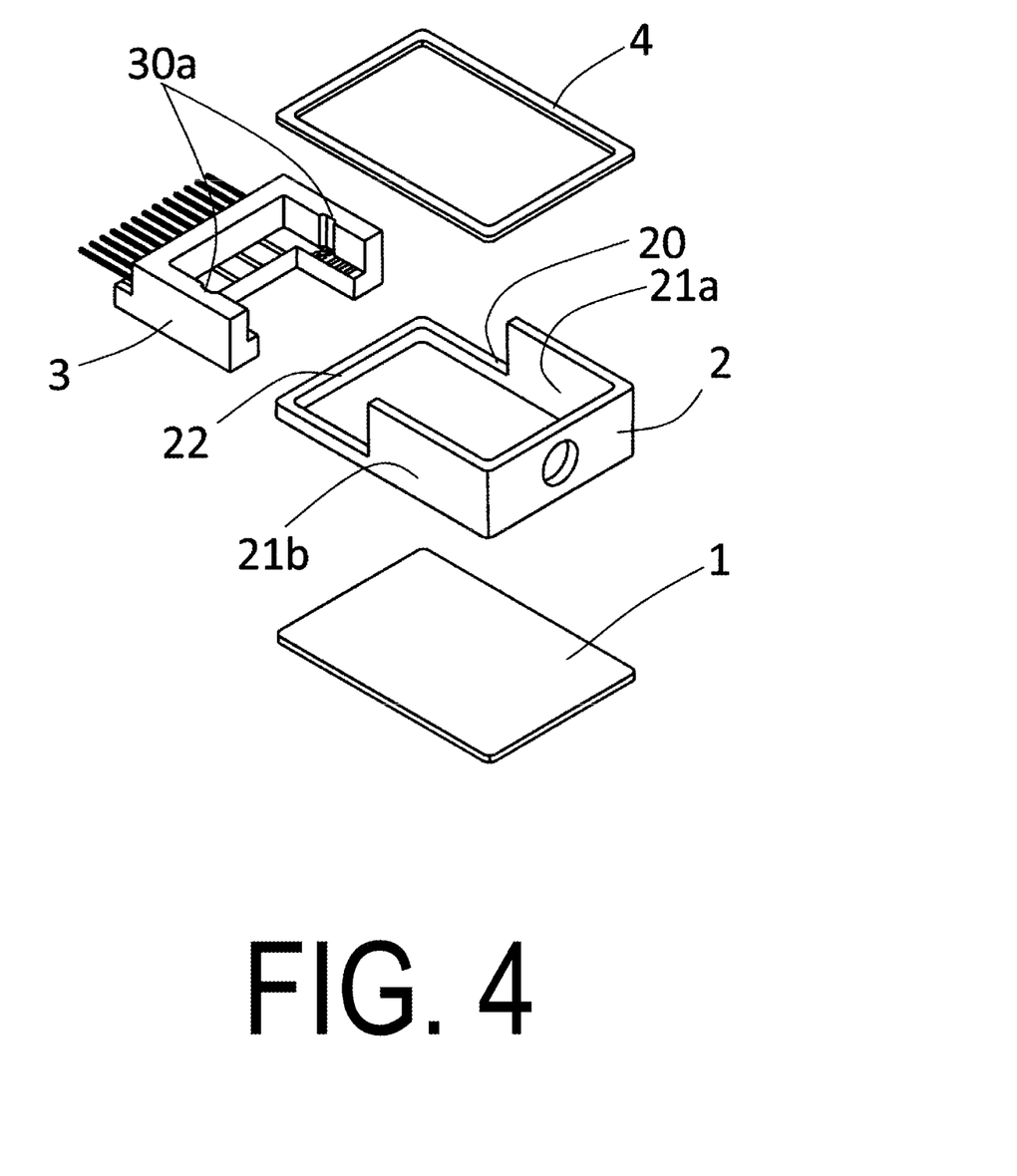
FIG. 4 is an exploded perspective view of the electronic component housing package illustrated in FIG. 1.
Figure 5:
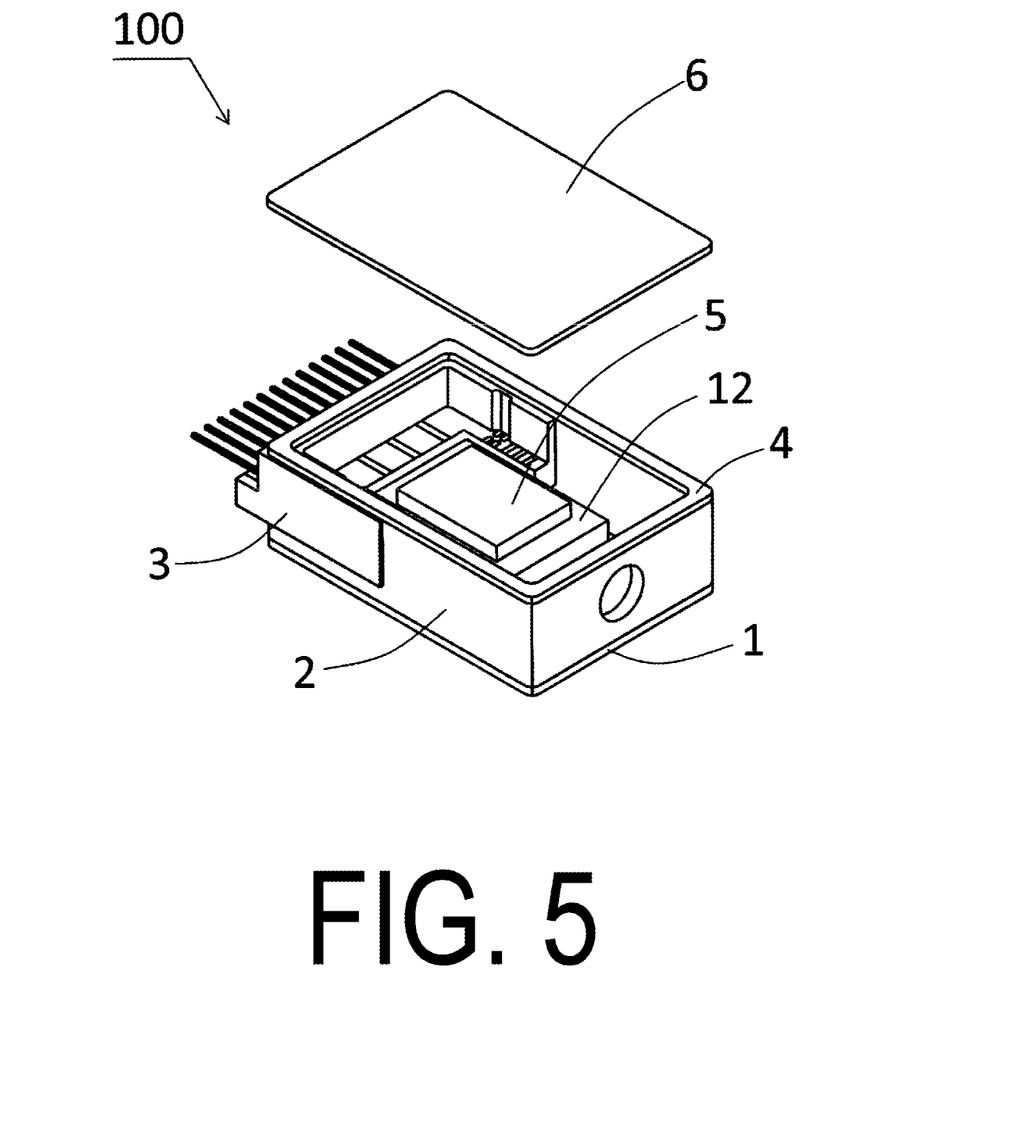
FIG. 5 is a perspective view of an electronic device illustrating one embodiment of the invention.

FIG. 1 is a perspective view illustrating the electronic component housing package 10 of one embodiment of the invention. FIG. 2 is a partially enlarged view of a section A in FIG. 1. FIG. 3 is a plan view of the package, and FIG. 4 is an exploded perspective view thereof. FIG. 5 is a perspective view illustrating one embodiment of an electronic device using the electronic component housing package illustrated in FIG. 1.

As illustrated in FIGS. 1, 2, 3 and 4, the electronic component housing package 10 of one embodiment of the invention (hereinafter, also simply referred to as package 10) includes a base plate 1, a frame body 2 provided on a top surface of the base plate 1 and having a hole part 20, and an input/output member 3 fixed in the hole part 20.

As illustrated in FIG. 5, the electronic device of one embodiment of the invention includes the package 10, an electronic component 5 mounted and housed in the package 10, and a lid 6 that seals the electronic component 5.

The base plate 1 is a member for hermetically sealing the electronic component 5 together with the frame body 2, the input/output member 3 and the lid 6. The base plate 1 is the member having a rectangular plate-like shape in a plan view, for example. The base plate 1 has, on the top surface, a mount region 11 in which the electronic component 5 is mounted.

In the embodiment illustrated in FIG. 5, a mount base plate 12 is mounted on the top surface of the base plate 1, with the electronic component 5 mounted on the top surface of the mount base plate 12. In this case, the mount region 11 means a region where the mount base plate 12 overlaps the base plate 1 when viewing the base plate 1 in a plan view. In some cases, the electronic component 5 may be mounted on the base plate 1 directly without using the mount base plate 12.

For example, a metal material, such as iron, copper, nickel, chromium, cobalt or tungsten, may be used as a material for the base plate 1. Alternatively, an alloy or a composite material made of these metals may be used. The base plate 1 may be made by performing metal working, such as rolling or stamping, on an ingot of such a metal material.

A good insulating material, for example, is used for the mount base plate 12. A ceramic material, such as an aluminum oxide sintered body, a mullite sintered body, a silicon carbide sintered body, an aluminum nitride sintered body, or a silicon nitride sintered body, may be used as the material for the mount base plate 12.

The frame body 2 is a member for holding the input/output member 3 together with the base plate 1. The frame body 2 is placed on the top surface of the base plate 1 so as to surround the mount region 11. The frame body 2 has a plurality of side wall parts including a pair of first side wall parts 21a, 21b disposed facing each other so as to place the mount region 11 between the pair of first side wall parts 21a, 21b, and a second side wall part 22 positioned between end portions of the pair of first side wall parts 21a, 21b. In the embodiment, the frame body 2 has four side wall parts including the pair of first side wall parts 21 (21a, 21b), and the second side wall part 22. Specifically, the frame body 2 further has a third side wall part 23. The third side wall part 23 is positioned between other ends of the pair of first side wall parts 21, and faces the second side wall part 22. The inner periphery and the outer periphery of the frame body 2 each have a substantially rectangular shape in a plan view.

The frame body 2 has a hole part 20 formed from the second side wall part 22 to the pair of first side wall parts 21. The hole part 20 is open to an inner surface and an outer surface of the frame body 2. Specifically, the hole part 20 is formed from a corner of the frame body 2 that is defined by the first side wall 21a, one of the pair of first side wall parts 21, and the second side wall part 22 to a corner of the frame body 2 that is defined by the first side wall 21b, the other one of the pair of first side wall parts 21, and the second side wall part 22. As can be seen from FIG. 4, the whole part 20 is provided by cutting off from the top surface of the frame body 2 to a middle of the frame body 2. The input/output member 3 is fixed in the hole part (i.e., a cutout) 20.

In an example of the embodiment, like the frame body 2, a seal ring 4 that surrounds the mount region 11 is attached to top portions of the frame body 2 and the hole part 20. While the seal ring 4 is a member for facilitating attachment of the lid 6, it may not be used in some cases. While the seal ring 4 is separate from the frame body 2, the seal ring 4 is functionally similar to the frame body 2 to surround the mount region 11 and seal the package. Therefore, the seal ring 4 may be regarded as part of the frame body 2.

In addition to the example of FIG. 4, the hole part 20 may be provided by cutting off from the bottom surface of the frame body 2 to a middle of the frame body 2. The hole part 20 may also be formed through a portion of the frame body 2 between the top and bottom surfaces thereof.

A metal material, such as iron, copper, nickel, chromium, cobalt or tungsten, may be used as materials for the frame body 2 and the seal ring 4. Alternatively, an alloy made of these metals may be used. The frame body 2 and the seal ring 4 may be made by performing metal working, such as rolling or stamping, on an ingot of such a metal material.

In the example in FIGS. 1, 2, 3 and 4, the frame body 2 has an opening 230 that opens to an inner side surface and an outer side surface of the third side wall part 23. An optical-fiber fixing part (not illustrated) is fixed so as to penetrate through the opening 230. The optical-fiber fixing part is a cylindrical member. The optical-fiber fixing part is provided to fix an optical fiber to be inserted into the optical-fiber fixing part, and to optically couple the optical fiber and the electronic component 5. In this case, the package 10 is used to house an optical semiconductor element.

The optical-fiber fixing part should preferably have a strength large enough to fix at least an optical fiber. Specifically, a metal material, such as iron, copper, nickel, chromium, cobalt or tungsten, may be used as a material for the optical-fiber fixing part. Alternatively, an alloy made of these metals may be used. The optical-fiber fixing part may be made by performing metal working, such as rolling or stamping, on an ingot of such a metal material.

In particular, it is preferable that the frame body 2 and the optical-fiber fixing part should be formed of the same metal material. This makes it possible to reduce the difference between the thermal expansion of the frame body 2 and the thermal expansion of the optical-fiber fixing part. As a result, the stress produced between the frame body 2 and the optical fiber fixing part in the heat cycle can be reduced.

When an electronic component 5 that receives and outputs optical signals is not used, eliminating the need for inputting and outputting of optical signals, it is not necessary to provide the opening 230 and optical-fiber fixing part and the like.

The input/output member 3 is a member for electrically connecting the electronic component 5 and an external circuit. The input/output member 3 is fixed in the hole part 20 of the frame body 2. The input/output member 3 has one end positioned inside the frame body 2, and the other end positioned outside the frame body 2. The input/output member 3 has a protruding part 31a protruding inside the first side wall parts 21a, 21b and inside the second side wall part 22, and a protruding part 31b protruding outside the second side wall part 22 like a shelf. The inner protruding part 31a is provided so as to surround part of the mounting region 11 from three directions when viewing the package 10 in a plan view. The input/output member 3 is formed so as to surround at least part of the mounting region 11 with the inner protruding part 31a.

The input/output member 3 is formed by preparing a plate-like first insulating member including the protruding parts 31 (31a, 31b), and a plate-like second insulating member to be bonded to a top surface of the first insulating member, and stacking the second insulating member on the first insulating member with a plurality of wiring conductors 32 formed on the top surface of the first insulating member in between.

A good insulating material is used for the first insulating member and the second insulating member that are used in the input/output member 3. A ceramic material, such as an aluminum oxide sintered body, a mullite sintered body, a silicon carbide sintered body, an aluminum nitride sintered body or a silicon nitride sintered body may be used as a material for those insulating members.

The wiring conductors 32 are provided on the top surface of the first insulating member. The wiring conductors 32 are electrically connected to the electronic component 5 by bonding wires or via bonding wires and a conductor such as a wiring pattern provided on the top surface of the mount base plate 12. Ends of the wiring conductors 32 disposed inside the frame body 2 are arranged so as to surround the mount region 11 from three directions when viewing the package 10 in a plan view. The ends of the wiring conductors 32 are formed on the top surface of the protruding part 31a. As a result, the distances between the ends of the wiring conductors 32 and the mount base plate 12 or the electronic component 5 can be reduced. This enables shorter connection between the wiring conductors 32 and the electronic component 5 by the bonding wires and the conductor such as the wiring pattern provided on the top surface of the mount base plate 12. Moreover, since the wiring conductors 32 are formed on single input/output member 3, it is possible to reduce the number of input/output members 3 provided in the package 10. This may result in an improvement of the frequency characteristic of the package 10, and miniaturization thereof.

In addition, the other ends of the wiring conductors 32 are drawn outside the second side wall part 22. The other ends of the wiring conductors 32 are formed on the top surface of the protruding part 31b. Accordingly, the electronic device 100 using the package 10 can be mounted in an external circuit with a small mounting area along the outer surface of the second side wall part 22. This ensures high integration and miniaturization of the package 10 and the electronic device 100 using the package 10.

Although FIGS. 1, 2, 3 and 4 illustrate an example where the other ends of the wiring conductors 32 are formed on the top surface of the protruding part 31b, more wiring conductors 32 may be provided by forming the other ends also on the bottom surface of the protruding part 31b, and further on each step of a step-shaped portion having different projecting heights.

DC or AC current is applied to these wiring conductors 32. For example, it is possible to supply DC power for the electronic component 5. Alternatively, the ground potential may be supplied. Many of the wiring conductors 32 are used as a low-frequency signal wiring or a high-frequency signal wiring. Arranging the high-frequency signal wiring on the inner protruding part 31a of the second side wall part 22 can shorten the wiring distance to the electronic component 5, enabling easy reduction of the high frequency loss.

The wiring conductors 32 are formed, for example, by a metallized layer. The metallized layer is formed by print-coating a conductive paste, obtained by mixing metal powder of W, Mo, Mn or the like with an adequate binder and solvent, on a predetermined surface of a ceramic green sheet in a predetermined pattern by screen printing, gravure printing, or the like, and then firing the pattern. Then, a metal plated layer of nickel and gold is formed on the top surface of the wiring conductors 32.

The metallized layer is also formed in a portion which is to be bonded to the first side wall parts 21 and the second side wall part 22 of the input/output member 3. This metallized layer is formed to be bonded to the hole part 20 of the frame body 2 via a brazing material.

To this end, the metallized layer is formed also on the top surface 3a of the input/output member 3, i.e., the top surface 3a of the second insulating member. The width of the top surface 3a of the second insulating member is greater than the thicknesses of the first side wall parts 21 and the second side wall part 22. With the seal ring 4 being used, the width is greater than the width of the seal ring 4. Therefore, the metallized layer formed on the top surface of the second insulating member is partially exposed to the first side wall parts 21 and second side wall part 22, or to both sides of the first side wall parts 21 and the second side wall part 22 without being covered with the seal ring 4. As a result, when the metallized layer and the frame body 2 are bonded together by a brazing material, an excess brazing material for bonding the input/output member 3 into the hole part 20 is accumulated on the exposed portion.

The accumulated brazing material may cause a meniscus between itself and the side surface of the frame body 2 or the side surface of the seal ring 4, improving the bonding strength between the input/output member 3 and the frame body 2. This improves the reliability of sealing of the electronic device 100. However, as the amount of brazing material is increased by increasing the bonding length of the top surface of the input member 3, the brazing material partially may flow to the bottom surface of the input/output member 3 through the junction between the perpendicular end face of the input/output member 3 and the perpendicular junction surface of the first side wall part 21, so that the amount of the brazing material becomes insufficient to form an adequate meniscus on the top surface of the input/output member 3.

However, the input/output member 3 has a narrow part 30 formed on part of the second insulating member by narrowing the width of the top surface 3a. The narrow part 30 is formed on the top surface 3a which is bonded to the first side wall part. The metallized layer is not formed on the inner surface of the input/output member 3. Therefore, the flow of the brazing material, which fixes the top surface 3a of the input/output member 3, toward the bottom surface is blocked by the narrow part 30. It is also possible to store a sufficient amount of a brazing material on the top surface 3a of the input/output member 3, achieving sufficient bonding of the input/output member 3 to the frame body 2 or the seal ring 4.

Specifically, in the package of FIGS. 1, 2, 3 and 4, the narrow part 30 is formed by a recessed groove 30a extending vertically from the upper end of the wall surface of the input/output member 3. The formation of the recessed groove 30a on the top surface 3a narrows the top surface 3a at the portion where the recessed groove 30a is formed. The width of the metallized layer provided on the top surface 3a becomes narrower by the recessed groove 30a, making it possible to block the flow of the brazing material that tends to flow toward the bottom surface of the input/output member 3.

It is to be noted that the width of the top surface 3a should be narrowed to narrow the width of the metallized layer, so that the narrow part 30 may be formed not only by the recessed groove 30a, but also by other means. For example, the narrow part 30 may be formed by providing a notch on one side of the top surface 3a. The following description is given referring to an example where the recessed groove 30a is formed.

The metallized layer is not applied to the side wall surface of the second insulating member. Therefore, a surplus brazing material does not wet-spread on the side wall surface of the input/output member 3. As a result, an excess brazing material does not adhere to the wiring conductors 32, so that an electric connection failure such as short-circuiting does not occur.

As a specific example of the size of the package in FIGS. 1, 3 and 4 in which the recessed groove 30a is formed, the width of exposure of the top surface 3a of the input/output member 3 from the outside of the first side wall part 21 is, for example, 0.17 mm, and the width of exposure of the top surface 3a of the input/output member 3 from the inside of the first side wall part 21 is, for example, 0.53 mm. The depth of the recessed groove 30a is 0.15 mm. Therefore, the distance between the bottom surface of the recessed groove 30a and the first side wall part 21 is 0.38 mm. That is, the width of the top surface 3a becomes 0.38 mm from 0.53 mm at the position of the recessed groove 30a. The brazing material hardly flows along the top surface 3a beyond the groove 30a.

The bottom surface of the recessed groove 30a should better not be disposed to overlap the bottom side of the first side wall part 21 or the seal ring 4. The bottom surface of the recessed groove 30a should preferably be formed to be positioned inward of the package than the inner surface of the seal ring 4. It is possible to reduce a possibility that thermal stress that is produced in the recessed groove 30a due to the difference in thermal expansion between the recessed groove 30a and the seal ring 4 would otherwise deform or significantly damage the input/output member 3.

The width of the top surface 3a should be large enough to block the flow of the brazing material, and should be reduced to 30% to 90% to bring about the blocking effect. Preferably, the width of the top surface 3a should be set to 50% to 80%.

The recessed groove 30a should preferably be provided in a portion near the termination of the input/output member 3. The termination means the portion of the input/output member 3 that is to be bonded to the first side wall part 21 and that is farthest from the second side wall part 22. The recessed groove 30a should better be provided on the termination side beyond a half of the position of the portion that is to be bonded to the first side wall part 21.

While the recessed groove 30a is provided on the inner wall surface of at least the first side wall part 21a, it should preferably be also provided on the inner wall surface of the other first side wall 21b. This makes it possible to store a sufficient amount of a brazing material between the positions of the top surface 3a where the two recessed grooves 30a are formed. When the recessed groove 30a is provided only on one side, the brazing material may flow through the other side.

Further, the recessed grooves 30a should be provided on both the inner wall surfaces of the first side wall part 21a and the other first side wall part 21b substantially equidistant from the second side wall part 22. This makes uniform the amounts of the brazing material flowing on both first side wall parts 21a, 21b, so that the bonding strengths of the input/output member 3 to both first side wall parts 21a, 21b can be made equal to each other. As a result, it is possible to suppress the damage at the junction of the input/output member 3 to one of the first side wall parts 21 caused by the stress by twisting of the base plate 1 and the frame body 2, or local concentration of stress.

It should be noted that it is not necessary to make the distances of the first side wall part 21a and the other first side wall part 21b from the second side wall part 22 completely equal to each other, and the distances should be set so as to ensure a substantially uniform amount of a brazing material and balance the bonding strengths.

Although FIGS. 1, 2, 3, 4 and 5 illustrate an example where the recessed groove 30a is provided at one location on each of the inner wall surfaces of the first side wall parts 21, such is not restrictive, and a plurality of recessed grooves 30a may be provided at necessary locations as needed.

In addition, the recessed groove 30a may be provided on the outer wall surface of the input/output member 3. In the example illustrated in FIGS. 1 to 5, since a margin for bonding the top surface of the input/output member 3 with a brazing material is small, the recessed groove 30a is not provided there. Since the bonding margin is small, a large amount of a brazing material does not flow. Moreover, the recessed groove 30a is provided on the inner surface, but not on the outer surface, the package 10 is made compact accordingly.

It is preferable that the recessed groove 30a should be provided in a curved shape between the bottom surface and the inner surface. This suppresses thermal stress caused by the difference in thermal expansion among the frame body 2, the input/output member 3 and the seal ring 4 from locally concentrating on a portion between the bottom surface and the inner surface of the recessed groove 30a. This can reduce the possibility of causing cracks on the input/output member 3 starting from the recessed groove 30a.

As can be seen from FIG. 2, the provision of the recessed groove 30a enables provision of a greater number of wiring conductors 32. The recessed groove 30a increases the width of the protruding part 31a inside the package. Using the space formed in this region permits a greater number of wiring conductors 32 to be disposed. FIG. 2 illustrates an example where wiring conductors 32a, 32b and wiring conductor 32c, 32d are disposed in two rows from the bottom surface of the recessed groove 30a toward the end face of the protruding part 31a.

The input/output member 3 may further have a side metallized layer formed on the periphery of the outer wall surface of the input/output member 3 that comes into contact with the bonding surface that is bonded to the first side wall part 21, the second side wall part 22, and the seal ring 4. The side metallized layer is provided to wet-spread the brazing material for bonding, for example, the input/output member 3 and the frame body 2 to a part of the outer wall surface of the input/output member 3.

The provision of the side metallized layer permits the brazing material to be provided spreading from the bonding interface between the frame body 2 and the input/output member 3 to the side wall surface of the input/output member 3. This makes it possible to improve the sealing properties between the input/output member 3 and the frame body 2 as well as to improve the bonding strength therebetween.

An electronic device 100 according to one embodiment of the invention, as illustrated in FIG. 5, includes the package 10, the electronic component 5, and the lid 6 described above.

The electronic component 5 is mounted on the mount region 11 of the base plate 1. The electronic component 5 is electrically connected to the wiring conductors 32 of the input/output member 3 via the wiring pattern provided on the top surface of the mount base plate 12 and bonding wires. An example of the electronic component 5 is an optical semiconductor device, an IC device, or a capacitor. The electronic device 100 of this embodiment uses an optical semiconductor device as the electronic component 5. For example, a light-emitting device typified by an LD (Laser Diode) device that emits light to an optical fiber, or a light-receiving device typified by a PD (Photo Diode) device that receives light from an optical fiber is an available example of the optical semiconductor device.

The lid 6 is a member for hermetically sealing the electronic component 5 together with the base plate 1, the input/output member 3 and the frame body 2. The lid 6 is bonded to the top surface of the frame body 2 or the top surface of the seal ring 4. The electronic component 5 is hermetically sealed in the space surrounded by the base plate 1, the frame body 2, the input/output member 3, and the lid 6. Sealing the electronic component 5 this way can suppress deterioration of the electronic component 5 which is used in electronic devices 100 for a long period of time.

For example, a metal material, such as iron, copper, nickel, chromium, cobalt or tungsten, or an alloy or a composite material made of these metals may be used as the material for the lid 6. The frame body 2 and the lid 6 are bonded together by, for example, a brazing material or the like.

The invention is not limited to the above-described embodiment, and various modifications, improvements and the like may be made to the embodiment without departing from the scope of the invention.

For example, although the base plate 1 has a rectangular shape in the embodiment, the shape is not restrictive. Specifically, the shape may be circular, or polygonal.

Although the mount region 11 is formed at a central portion of the top surface of the base plate 1 in the embodiment, the location is not restrictive. Specifically, the mount region 11 may be provided at an end portion of the top surface of the base plate 1. In this case, the frame body 2 may also be provided at the end portion of the top surface of the base plate 1 in such a way as to surround the mount region 11.

In the embodiment, the base plate 1 has only one mount region 11, which is not restrictive. Specifically, the base plate 1 may have a plurality of mounting regions 11 and the mounting regions 11 may have the respective electronic components 5 mounted thereon.

In the embodiment, the frame body 2 has four side wall parts, which is not restrictive. Specifically, the frame body 2 may five or more side wall parts, so that the frame body 2 has a polygon shape in a plan view.

Although the frame body 2 is formed integrally in the embodiment, such is not restrictive. Specifically, the pair of first side wall parts 21 and the second side wall part 22 may be formed separately. In this case, the pair of first side wall parts 21 and the second sidewall part 22 may be bonded together by a bonding member such as a brazing material.

REFERENCE SIGNS LIST

1: Base plate
11: Mount region

12: Mount base plate
2: Frame body
20: Hole part
21: First side wall part
22: Second side wall part
23: Third side wall part
230: Opening
3: Input/output member
3a: Top surface
30: Narrow part
30a: Recessed groove
31a, 31b: Protruding part
32: Wiring conductor
4: Seal ring
5: Electronic component
6: Lid
10: Electronic component housing package (package)
100: Electronic device

What is claimed is:

1. An electronic component housing package comprising:
   a metal base plate having a mount region on a top surface where an electronic component is mounted;
   a metal frame body placed on the top surface of the metal base plate so as to surround the mount region, the metal frame body comprising a plurality of side wall parts including a pair of first side wall parts disposed facing each other so as to place the mount region between the pair of first side wall parts and a second side wall part disposed so as to connect end portions of the pair of first side wall parts, and comprising a cutout extending from the second side wall part to the pair of first side wall parts; and
   an input/output member bonded to the cutout via a brazing material, the input/output member comprising protruding parts inward of the pair of first side wall parts and the second side wall part and outward of the second side wall part and a plurality of wiring conductors to be electrically connected to the electronic component on the protruding parts;
   the input/output member including a portion which is bonded to one of the pair of first side wall parts, a top surface of the portion having a narrow part having a narrow width,
   the narrow part being formed by forming a recessed groove provided in a curved shape extending vertically in an upper end of a wall surface of the input/output member, a part of the plurality of wiring conductors being disposed in two rows from a bottom surface of the recessed groove toward end faces of the protruding parts.

2. The electronic component housing package according to claim 1, wherein the recessed groove is provided on an inner wall surface of the input/output member.

3. The electronic component housing package according to claim 1, wherein the recessed groove is provided on the each wall surface which is bonded to the pair of first side wall parts.

4. The electronic component housing package according to claim 3, wherein the recessed grooves are provided on wall surfaces which are bonded to the first side wall parts and are equidistant from the second side wall part.

5. An electronic device comprising:
   the electronic component housing package described in claim 1;
   an electronic component mounted in the mount region of the electronic component housing package and connected to the wiring conductors via conductors; and
   a lid bonded to the top surface of the frame body to seal the electronic component.

* * * * *